(12) United States Patent
Yoon et al.

(10) Patent No.: US 7,932,530 B2
(45) Date of Patent: Apr. 26, 2011

(54) DISPLAY SUBSTRATE AND METHOD OF MANUFACTURING THE SAME

(75) Inventors: Soo-Wan Yoon, Suwon-si (KR); Chong-Chul Chai, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 12/357,149

(22) Filed: Jan. 21, 2009

(65) Prior Publication Data
US 2009/0272981 A1 Nov. 5, 2009

(30) Foreign Application Priority Data
Apr. 30, 2008 (KR) .................. 10-2008-0040733

(51) Int. Cl.
*H01L 33/00* (2010.01)
(52) U.S. Cl. .......... 257/98; 257/290; 257/435; 257/443; 257/E33.061
(58) Field of Classification Search ............. 257/98, 257/290, 435, 443
See application file for complete search history.

(56) References Cited

U.S. PATENT DOCUMENTS

| | | | | |
|---|---|---|---|---|
| 7,102,168 | B2 * | 9/2006 | Rhee et al. | 257/72 |
| 2003/0013236 | A1 * | 1/2003 | Nakata et al. | 438/149 |
| 2004/0239838 | A1 * | 12/2004 | Lai | 349/106 |
| 2008/0100565 | A1 * | 5/2008 | Song et al. | 345/107 |

FOREIGN PATENT DOCUMENTS

| | | |
|---|---|---|
| JP | 62-092472 | 4/1987 |
| JP | 2004146690 | 5/2004 |
| KR | 1020040061950 | 7/2004 |
| KR | 1020050117347 | 12/2005 |

\* cited by examiner

*Primary Examiner* — Wai-Sing Louie
(74) *Attorney, Agent, or Firm* — H.C. Park & Associates, PLC

(57) ABSTRACT

A display substrate includes a gate electrode, a gate insulating layer, and a semiconductor layer that are sequentially formed on a substrate. Also, the display substrate includes a color filter layer formed on the substrate and exposing a portion of the semiconductor layer, and source and drain electrodes that each overlap with the semiconductor layer and the color filter layer. The gate electrode, the gate insulating layer, and the semiconductor layer have the same shape as each other, and the gate electrode is insulated from the gate insulating layer and the semiconductor layer by the color filter layer.

6 Claims, 14 Drawing Sheets

DISPLAY SUBSTRATE AND METHOD OF MANUFACTURING THE SAME

CROSS-REFERENCE TO RELATED APPLICATION

This application claims priority from and the benefit of Korean Patent Application No. 10-2008-0040733, filed on Apr. 30, 2008, which is hereby incorporated by reference for all purposes as if fully set forth herein.

BACKGROUND OF INVENTION

1. Field of the Invention

The present invention relates to a display substrate and a method of manufacturing the same. More particularly, the present invention relates to a display substrate that may have improved driving characteristics and a method of manufacturing the display substrate.

2. Discussion of the Background

It is desirable for the thickness of a display apparatus to be decreased while the display performance thereof is maintained. A display apparatus may include a plastic substrate or a glass substrate as a base substrate so that the display apparatus may be lightweight and have good mobility.

However, when the base substrate of the display apparatus is a plastic substrate, the plastic substrate may repeatedly expand and shrink due to temperature variations during processes of forming thin film transistors on the plastic substrate. As a result, layers constituting the thin film transistors may be misaligned.

SUMMARY OF INVENTION

The present invention provides a display substrate that may have improved driving characteristics.

The present invention also provides a method of manufacturing the display apparatus.

Additional features of the invention will be set forth in the description which follows, and in part will be apparent from the description, or may be learned by practice of the invention.

The present invention discloses a display substrate including a substrate, a gate electrode arranged on the substrate, a gate insulating layer arranged on the gate electrode, a semiconductor layer arranged on the gate insulating layer, a color filter layer arranged on the substrate and exposing the semiconductor layer, a source electrode arranged on the color filter layer and the semiconductor layer, a drain electrode spaced apart from the source electrode and arranged on the color filter layer and the semiconductor layer, a protective layer arranged on the semiconductor layer, the source electrode, and the drain electrode, and a pixel electrode arranged on the protective layer and connected to the drain electrode.

The present invention also discloses a method of manufacturing a display substrate including forming a gate electrode, a gate insulating layer, and a semiconductor layer on a substrate, and forming a color filter layer on the substrate. The color filter layer exposes the semiconductor layer. Then, a source electrode and a drain electrode spaced apart from the source electrode are formed such that each of the source and drain electrodes overlaps with the semiconductor layer and the color filter layer. After a protective layer is formed on the semiconductor layer, the color filter layer, the source electrode, and the drain electrode, a pixel electrode is formed on the protective layer and connected to the drain electrode.

The present invention also discloses a method of manufacturing a display substrate including forming a gate electrode and a gate insulating layer on a substrate, and forming a photoresist layer on the gate insulating layer. The photoresist layer exposes a portion of the gate insulating layer. Then, a semiconductor layer is formed on the gate insulating layer and the photoresist layer, and the photoresist layer is removed from the gate insulating layer. Next, a source electrode and a drain electrode spaced apart from the source electrode are formed such that each of the source and drain electrodes overlaps with the semiconductor layer and the gate insulating layer. After a protective layer is formed on the gate insulating layer, the semiconductor layer, the source electrode and the drain electrode, a pixel electrode is formed on the protective layer and connected to the drain electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
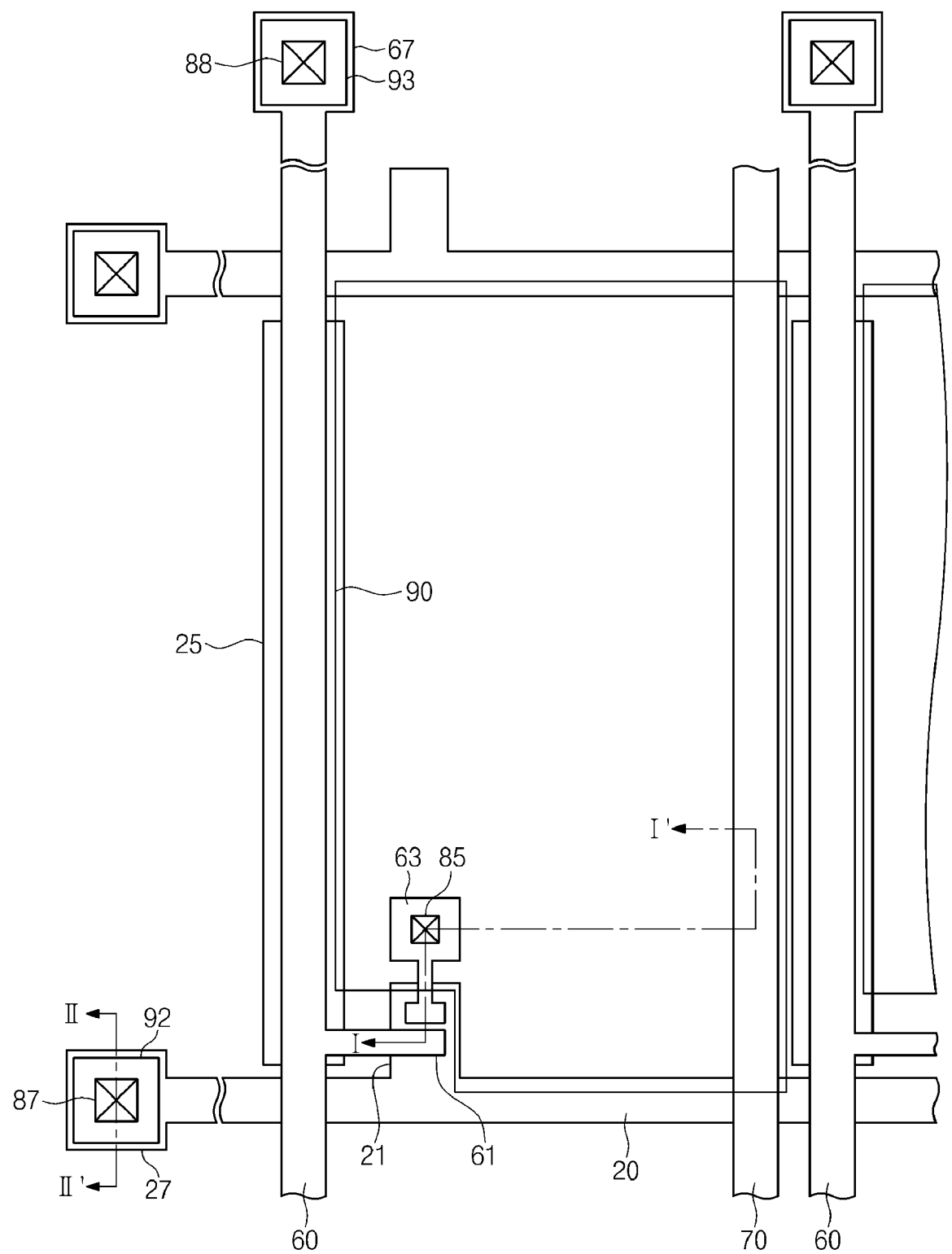
FIG. 1 is a plan view showing an exemplary embodiment of a display substrate according to the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on," "connected to," or "coupled to" another element or layer, it can be directly on, directly connected to, or directly coupled to the other element or layer, or intervening elements or layers may be present. In contrast, when an element is referred to as being "directly on," "directly connected to," or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers, and/or sections, these elements, components, regions, layers and/or sections should not be limited by these terms. These terms are only used to distinguish one element, component, region, layer, or section from another region, layer or section.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a," "an," and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

Figure 2:
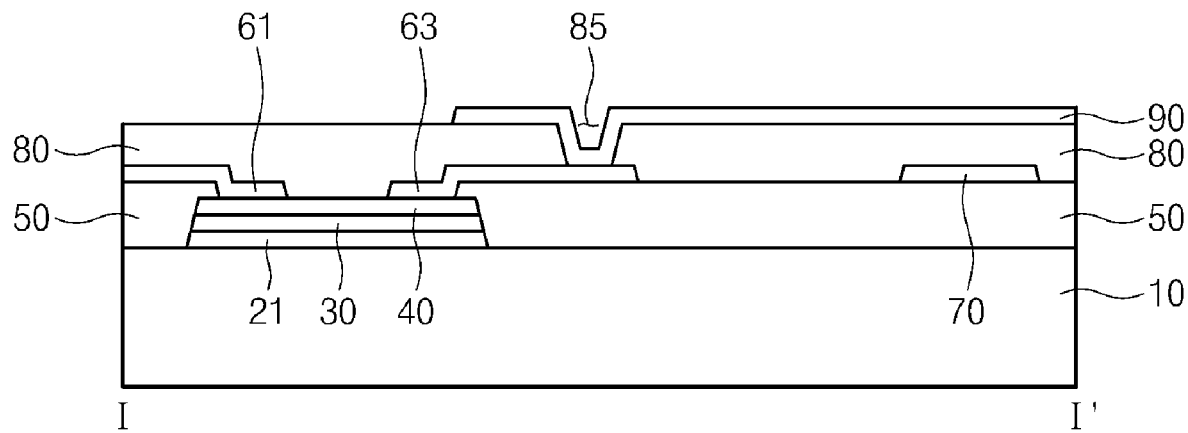
FIG. 2 is a sectional view taken along line I-I' of FIG. 2.
Figure 3A:
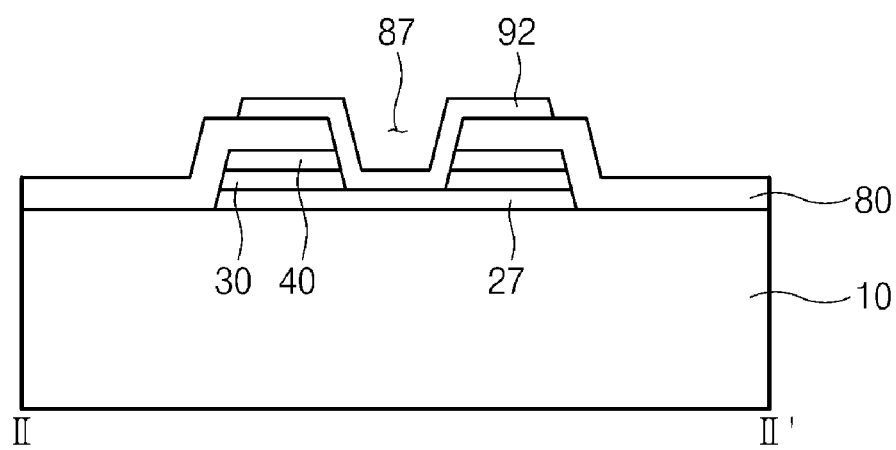
FIG. 3A and FIG. 3B are sectional views taken along line II-II' of FIG. 1.
Figure 3B:
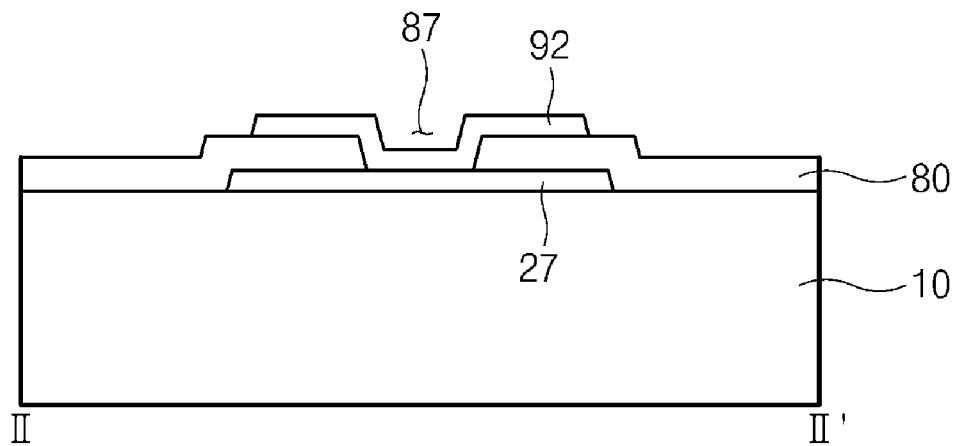

FIG. 1 is a plan view showing an exemplary embodiment of a display substrate according to the present invention, FIG. 2 is a sectional view taken along line I-I' of FIG. 2, and FIG. 3A and FIG. 3B are sectional views taken along line II-II' of FIG. 1. Particularly, FIG. 3A shows a sectional structure of a first pad connection electrode according to an exemplary embodiment of the present invention taken along line II-II' of FIG. 2, and FIG. 3B shows a sectional structure of a first pad connection electrode according to another exemplary embodiment of the present invention taken along line II-II' of FIG. 2.

Referring to FIG. 1, FIG. 2, and FIG. 3A, a display substrate 10 includes a first conductive pattern group 20, 21, 25, and 27, a gate insulating layer 30, a semiconductor layer 40, a color filter layer 50, a second conductive pattern group 60, 61, 63, 67, and 70, a protective layer 80, and a third conductive pattern group 90, 92, and 93.

The substrate 10 may include a flexible insulating material and may have a flat plate-like shape. For example, the substrate 10 may include a transparent plastic material such as kapton, polyethersulphone (PES), polycarbonate (PC), polyimide (PI), polyethyleneterephthalate (PET), polyethylenenaphthalate (PEN), polyacrylate (PAR), or fiber reinforced plastic (FRP).

The first conductive pattern group 20, 21, 25, and 27 includes a gate line 20, a gate electrode 21, a gate pad 27, and a light-blocking pattern 25, which are formed on the substrate 10.

The gate line 20 is formed on the substrate 10 and extends in a direction, e.g., a horizontal direction as shown in FIG. 1. The gate electrode 21 is branched from the gate line 20 and protrudes in a direction perpendicular to the horizontal direction in which the gate line 20 extends. The gate pad 27 is positioned at an end of the gate line 20 and is integrally formed with the gate line 20. The gate pad 27 may have a rectangular-like shape. The gate pad 27 is connected to a driving device (not shown) to receive a driving signal.

The gate pad 27 applies the driving signal, which is provided from the driving device, to the gate line 20. The light-blocking pattern 25 overlaps with a data line 60 and is electrically separated from the gate line 20.

The gate insulating layer 30 is formed on the first conductive pattern group 20, 21, 25, and 27 and may have substantially the same shape as the first conductive pattern group 20, 21, 25, and 27. The gate insulating layer 30 may include an inorganic material, such as silicon nitride ($SiN_x$) or silicon oxide ($SiO_x$), to insulate adjacent conductive layers.

The semiconductor layer 40 is formed on the gate insulating layer 30. The semiconductor layer 40 may have substantially the same shape as the gate insulating layer 30 in a plan view. That is, although not shown in FIG. 1, the semiconductor layer 40 may have substantially the same shape as the first conductive pattern group 20, 21, 25, and 27. In FIG. 1, the semiconductor layer 40 has been omitted for convenience of illustration of the first conductive pattern group 20, 21, 25, and 27.

The semiconductor layer 40 may include an active layer and an ohmic contact layer. The active layer may include a semiconductor material such as amorphous silicon or polysilicon, and the ohmic contact layer may be formed by implanting impurities into the semiconductor material.

The color filter layer 50 is formed on the substrate 10 such that the semiconductor layer 40 is exposed. In addition, the color filter layer 50 covers the first conductive pattern group 20, 21, 25, and 27 and a side surface of the gate insulating layer 30. The color filter layer 50 may be formed to cover a portion of an upper surface of the semiconductor layer 40. The color filter layer 50 may include an organic material to display a red color, a green color, and a blue color. The color filter layer 50 insulates the first conductive pattern group 20, 21, 25, and 27 from each other.

The second conductive pattern group includes a data line 60, a source electrode 61, a drain electrode 63, a data pad 67, and a storage line 70.

The data line 60 is formed on the color filter layer 50 and crosses the gate line 20. The data pad 67 is positioned at an end of the data line 60 and is integrally formed with the data line 60. The data pad 67 may have a rectangular-like shape. The data pad 67 is connected to a driving device (not shown) to receive a driving signal.

The source electrode 61 is branched from the data line 60 and formed on the semiconductor layer 40 and the color filter layer 50. The drain electrode 63 is spaced apart from the source electrode 61 and formed on the semiconductor layer 40 and the color filter layer 50. A distance between the source electrode 61 and the drain electrode 63 is defined by the color filter layer 50 that covers the portion of the semiconductor layer 40. For example, the color filter layer 50 covers the portion of the semiconductor layer 40 and exposes remaining portions of the semiconductor layer 40. The distance between the source electrode 61 and the drain electrode 63 corresponds to the exposed portions of the semiconductor layer 40. Accordingly, the distance between the source electrode 61 and the drain electrode 63 is defined by the color filter layer 50. The source electrode 61 and the drain electrode 63 are positioned on the color filter layer 50, so that parasitic capacitance between the gate electrode 21 and the source and drain electrodes 61 and 63 may be reduced.

The storage line 70 is formed on the color filter layer 50 and extends in the same direction as the data line 60. In addition, the storage line 70 overlaps with the pixel electrode 90.

The protective layer 80 is formed on the semiconductor layer 40, the color filter layer 50, and the second conductive pattern group 60, 61, 63, 67, and 70 and may include an insulating material such as silicon oxide ($SiO_x$) or silicon nitride ($SiN_x$). The protective layer 80 protects the semiconductor layer 40, the color filter layer 50, and the second conductive pattern group 60, 61, 63, 67, and 70 from external impact. In addition, the protective layer 80 is provided with a first contact hole 85 that partially exposes the drain electrode 63.

The third conductive pattern group includes a pixel electrode 90, a first pad connection electrode 92, and a second pad connection electrode 93.

The pixel electrode 90 may include a transparent conductive material and is formed on the protective layer 80. The pixel electrode 90 is connected to the drain electrode 63 through the first contact hole 85. In the present exemplary embodiment, the pixel electrode 90 may include a transparent conductive material such as indium tin oxide (ITO) or indium zinc oxide (IZO).

The first pad connection electrode 92 is formed on the protective layer 80 and connected to the gate pad 27. According to an exemplary embodiment of the present invention, the first pad connection electrode 92, as shown in FIG. 3A, may be connected to the gate pad 27 through a second contact hole 87 formed thorough the protective layer 80, the semiconductor layer 40, and the gate insulating layer 30. In addition, according to another exemplary embodiment of the present invention, the first gate pad connection electrode 92, as shown in FIG. 3B, may be connected to the gate pad 27 through a second contact hole 87 formed through the protective layer 80. In the exemplary embodiment of FIG. 3B, the gate insulating layer 30 and the semiconductor layer 40 between the protective layer 80 and the gate pad 27 may be removed from an area, in which the gate pad 27 is formed, by an additional etching process or an etching process that is applied to pattern other layers on the display substrate 10.

The second pad connection electrode 93 is formed on the protective layer 80 and connected to the data pad 67 through a third contact hole 88 formed through the protective layer 80.

Figure 4A:
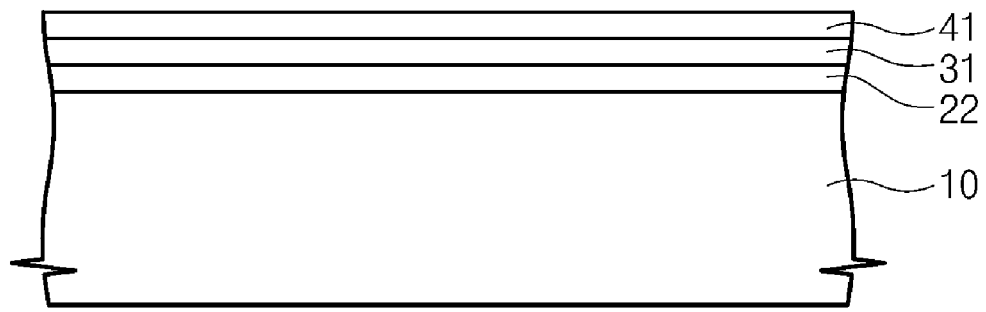
FIG. 4A, FIG. 4B, FIG. 4C, FIG. 4D, FIG. 4E, FIG. 4F, FIG. 4G, FIG. 4H, FIG. 4I, FIG. 4J are process views showing a method of manufacturing a display substrate according to an exemplary embodiment of the present invention.
Figure 4B:
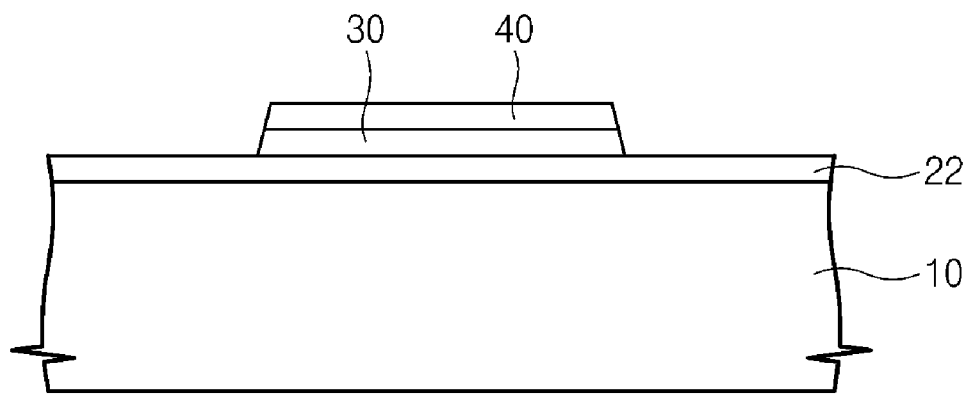
Figure 4C:
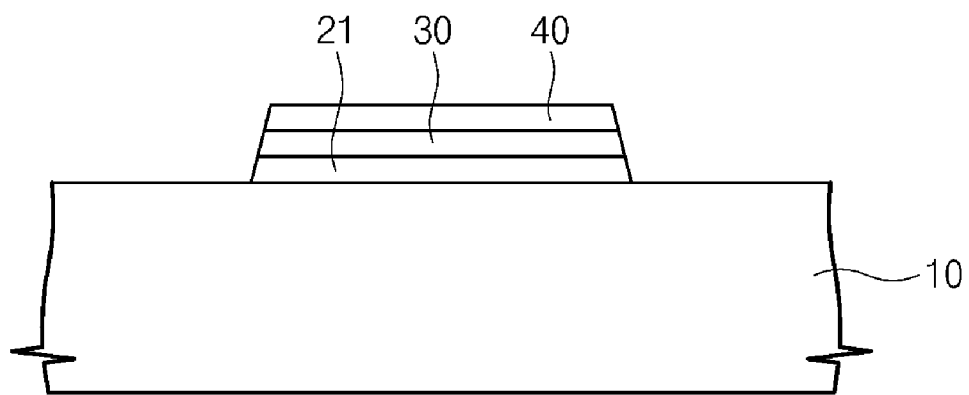
Figure 4D:
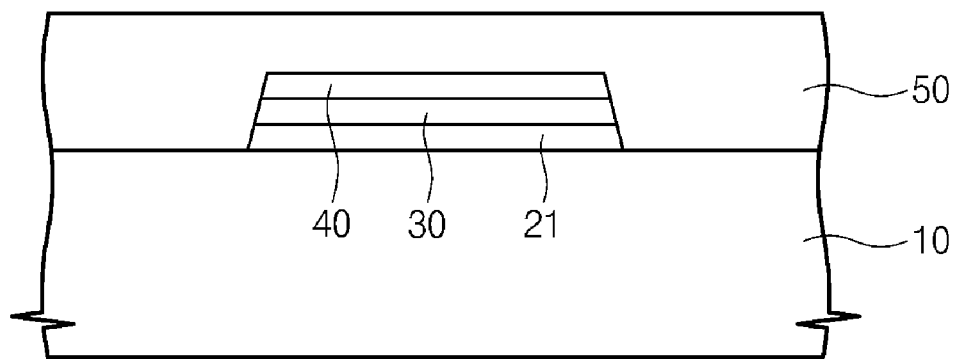
Figure 4E:
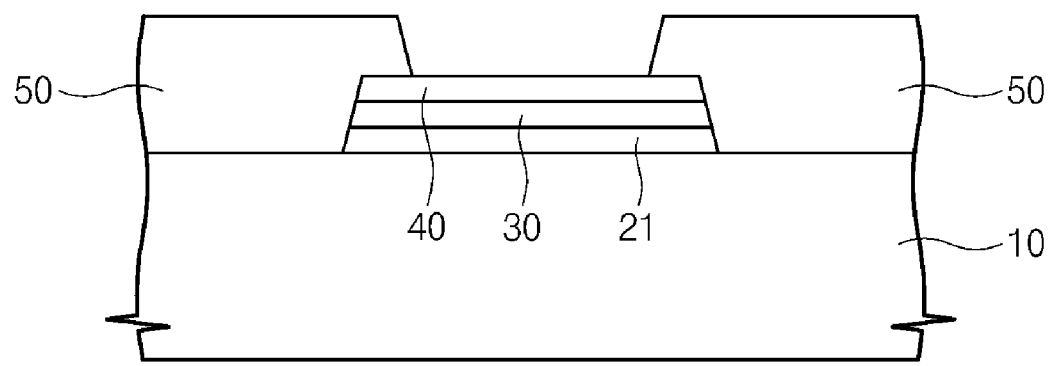
Figure 4F:
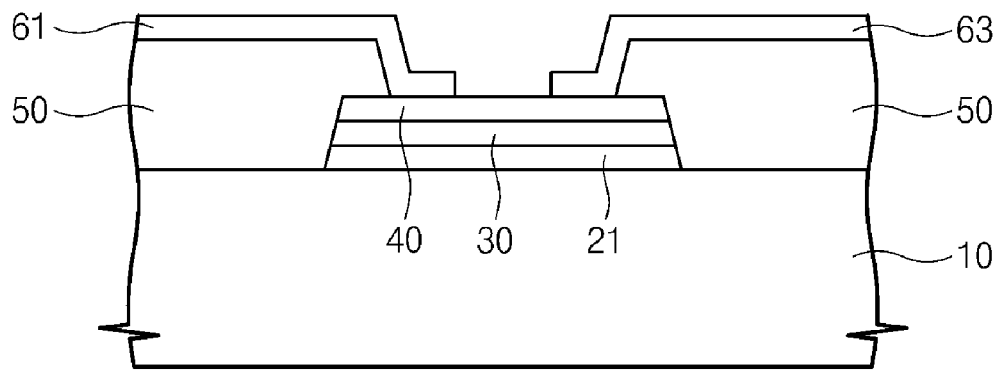
Figure 4G:
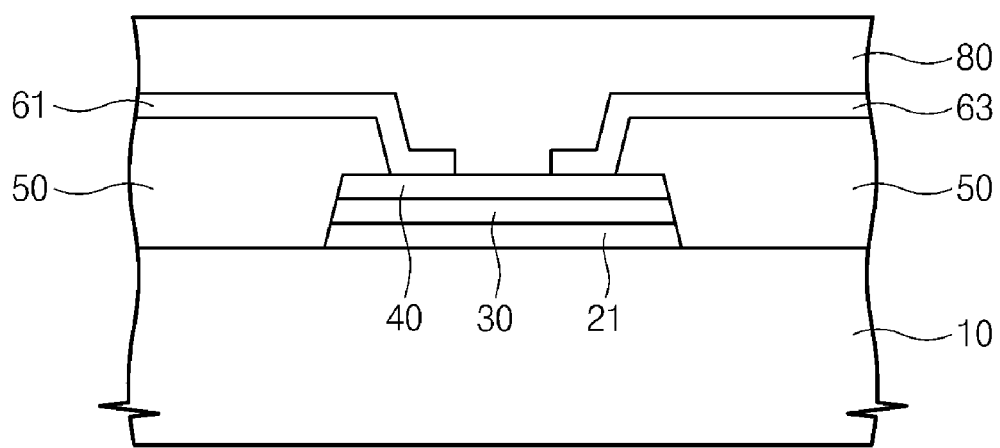
Figure 4H:
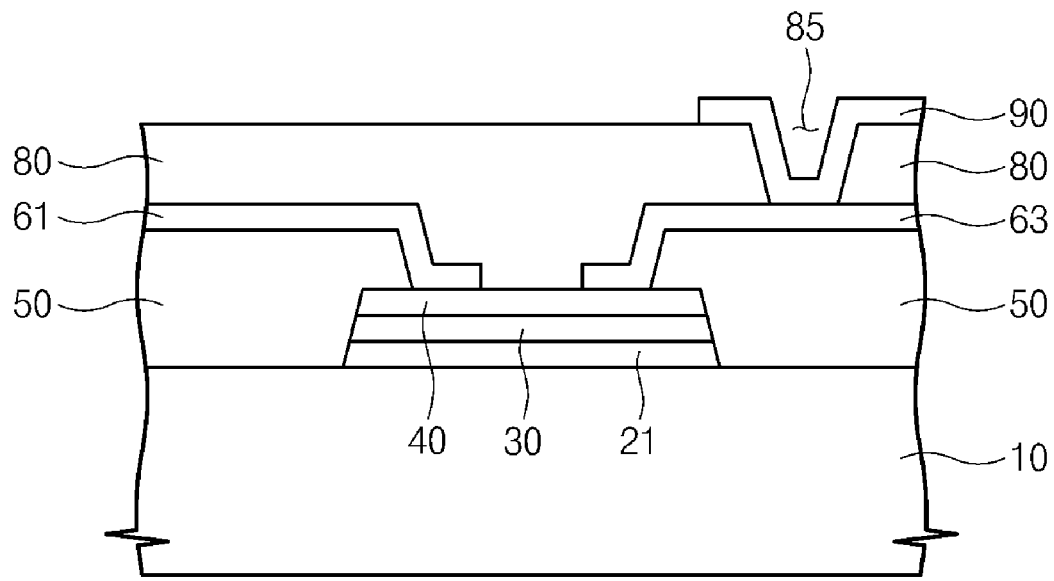
Figure 4I:
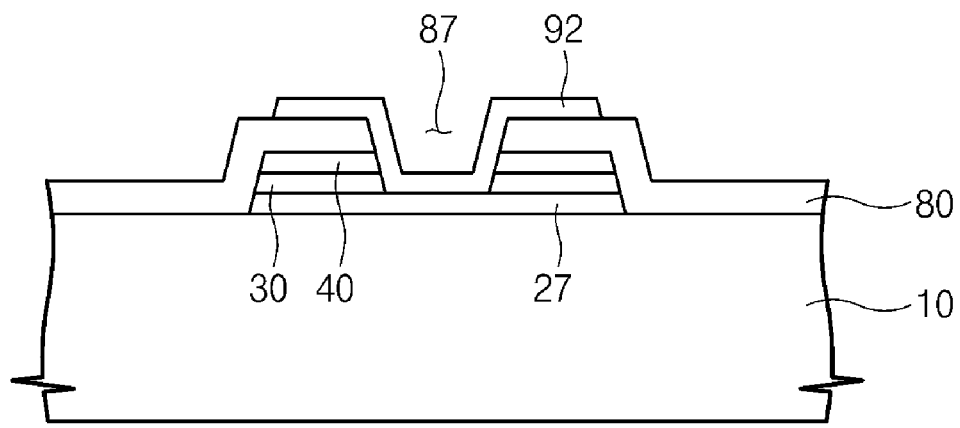
Figure 4J:
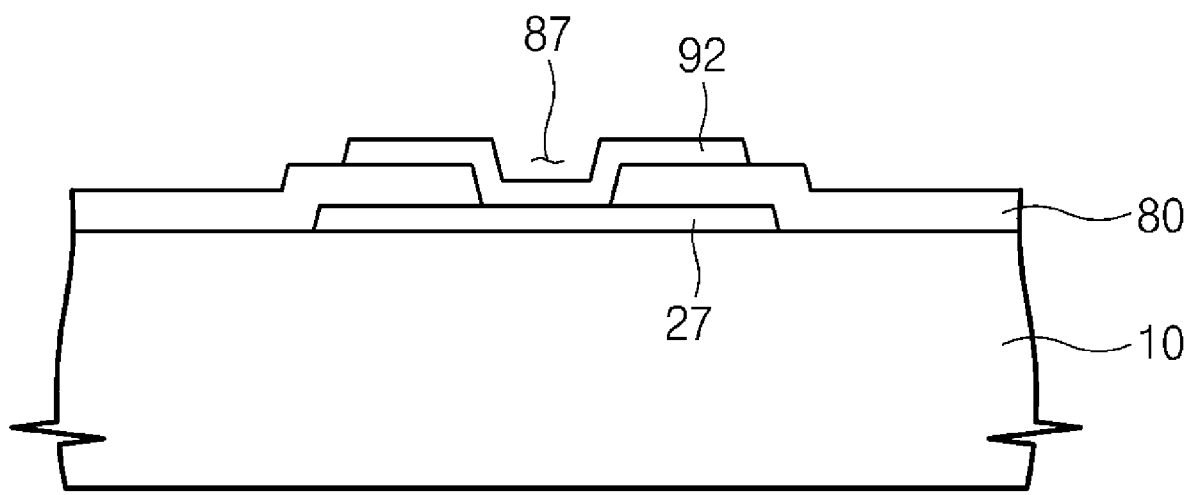

FIG. 4A, FIG. 4B, FIG. 4C, FIG. 4D, FIG. 4E, FIG. 4F, FIG. 4G, FIG. 4H, FIG. 4I, and FIG. 4J are process views showing methods of manufacturing a display substrate according to various exemplary embodiments of the present invention. Particularly, FIG. 4A, FIG. 4B, FIG. 4C, FIG. 4D, FIG. 4E, FIG. 4F, FIG. 4G, FIG. 4H, and FIG. 4I show a method of manufacturing a display substrate according to an exemplary embodiment of the present invention, and FIG. 4A and FIG. 4J show a method of manufacturing a display substrate according to another exemplary embodiment of the present invention.

Referring to FIG. 4A, a gate metal 22, an insulating material 31, and a semiconductor material 41 are sequentially formed on a substrate 10, which may include a transparent plastic material.

Then, as shown in FIG. 4B, the insulating material 31 and the semiconductor material 41 may be etched through a photolithography process using a first mask (not shown), to form a gate insulating layer 30 and a semiconductor layer 40.

Referring to FIG. 4C, the gate metal 22 may also be etched by the photolithography process using the first mask to form a first conductive pattern group including the gate electrode 21. The first conductive pattern group may include the gate electrode 21, a gate line, a gate pad, and a light blocking pattern, which are formed on the substrate 10.

Referring to FIG. 4D, a color filter layer 50 is formed on the substrate 10 to cover the gate electrode 21, the gate insulating layer 30, and the semiconductor layer 40. The color filter layer 50 may be formed by depositing organic materials that display a red color, a green color, and a blue color.

Next, as shown in FIG. 4E, a portion of the color filter layer 50, which covers the semiconductor layer 40, may be etched through a photolithography process to expose a portion of an upper surface of the semiconductor layer 40 through an area from which the color filter layer 50 is removed.

Referring to FIG. 4F, a data metal may be deposited on the semiconductor layer 40 and the color filter layer 50 by a sputtering method. When the deposited data metal is patterned through a photolithography process, a second conductive pattern group including a source electrode 61 and a drain electrode 63 is formed. The second conductive pattern group may include the source electrode 61, the drain electrode 63, a data line, a data pad, and a storage line.

Referring to FIG. 4G, a protective layer 80 is formed on the semiconductor layer 40, the source electrode 61, and the drain electrode 63. The protective layer 80 may be formed by depositing an insulating material using a chemical vapor deposition method.

Referring to FIG. 4H, the protective layer 80 is partially etched to form a first contact hole 85 through which a portion of the drain electrode 63 is exposed. Then, when a transparent conductive material is deposited on the protective layer 80 through a sputtering method and the transparent conductive material is patterned, a third conductive pattern group including a pixel electrode 90 is formed. The pixel electrode 90 may be connected to the drain electrode 63 through the first contact hole 85. The third conductive pattern group may include the pixel electrode 90, the first pad connection electrode 92 (see FIG. 4I), and the second pad connection electrode.

In an area in which the gate pad 27 is formed, the first pad connection electrode 92, as shown in FIG. 4I, may be connected to the gate pad 27 through a contact hole 87 formed through the gate insulating layer 30, the semiconductor layer 40, and the protective layer 80.

Alternatively, as shown in FIG. 4J, the first pad connection electrode 92 may be connected to the gate pad 27 through the second contact hole 87 formed through the protective layer 80. The gate pad 27 may be formed using a halftone mask (not shown).

Hereinafter, a method of forming the display substrate according to another exemplary embodiment of the present invention will be described with reference to FIG. 4A and FIG. 4J. First, a photoresist (not shown) is formed on the semiconductor material 41 after sequentially forming the gate metal 22, the insulating material 31, and the semiconductor material 41 on the substrate 10. Then, when the photoresist is exposed using a halftone mask and developed, a photoresist pattern (not shown) is formed in an area in which the gate pad 27 is formed. The semiconductor material 41, the insulating material 31, and the gate metal 22 are sequentially etched using the photoresist pattern as a mask to form the gate pad 27. Next, after the photoresist pattern is removed, a photoresist pattern is formed again such that the semiconductor material 41 in the area in which the gate pad 27 is formed is exposed. Then, when the semiconductor material 41 and the insulating material 31 in the area for the gate pad 27 are etched using the photoresist pattern as a mask and the photoresist pattern is removed, the gate pad 27 remains on the substrate 10 and is exposed, as shown in FIG. 4J. In this exemplary embodiment, the protective layer 80 and the first pad connection electrode 92 may be formed through the same processes as described with reference to FIG. 4I.

FIG. 5A, FIG. 5B, FIG. 5C, FIG. 5D, and FIG. 5E are process views showing a method of manufacturing a display substrate according to another exemplary embodiment of the present invention.

Figure 5A:
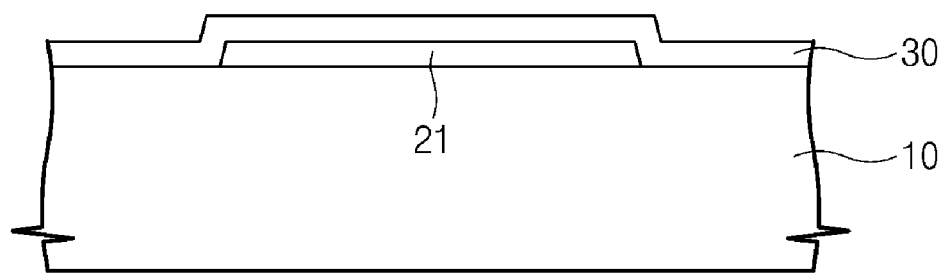
FIG. 5A, FIG. 5B, FIG. 5C, FIG. 5D, FIG. 5E, FIG. 5F, and FIG. 5G are process views showing a method of manufacturing a display substrate according to another exemplary embodiment of the present invention.

Referring to FIG. 5A, a gate metal is deposited on a substrate 10, which may be made of a transparent plastic material, and patterned to form a gate electrode 21 on the substrate 10. An insulating material is formed on the substrate 10 and the gate electrode 21 to form a gate insulating layer 30.

Figure 5B:
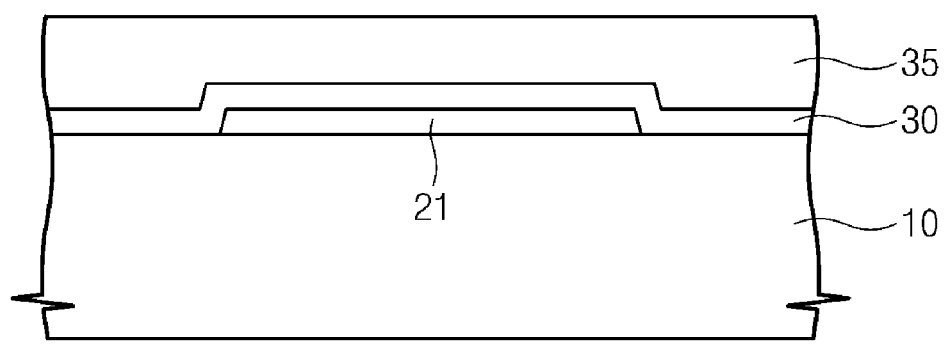

Referring to FIG. 5B, a photoresist 35 is coated on the gate insulating layer 30.

Figure 5C:
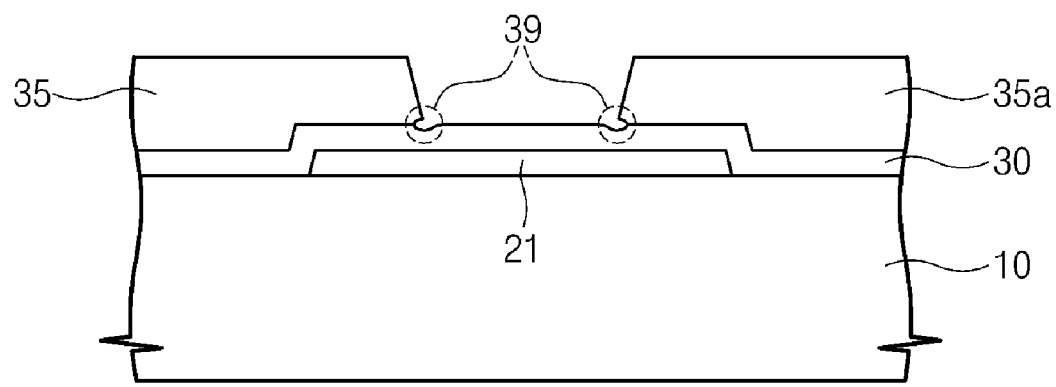

Then, as shown in FIG. 5C, a portion of the photoresist 35, which overlaps with the gate electrode 21, is etched to form a photoresist pattern 35a, so that an upper surface of the gate insulating layer 30 is partially exposed. During the etching of the photoresist 35, an area of the gate insulating layer 30, at which the exposed upper surface of the gate insulating layer 30 meets the photoresist pattern 35a, is overetched, thereby creating an undercut 39 beneath the photoresist pattern 35a. For instance, when the photoresist 35 is etched by a dry etching process, a portion of the gate insulating layer 30 may be thinned.

Figure 5D:
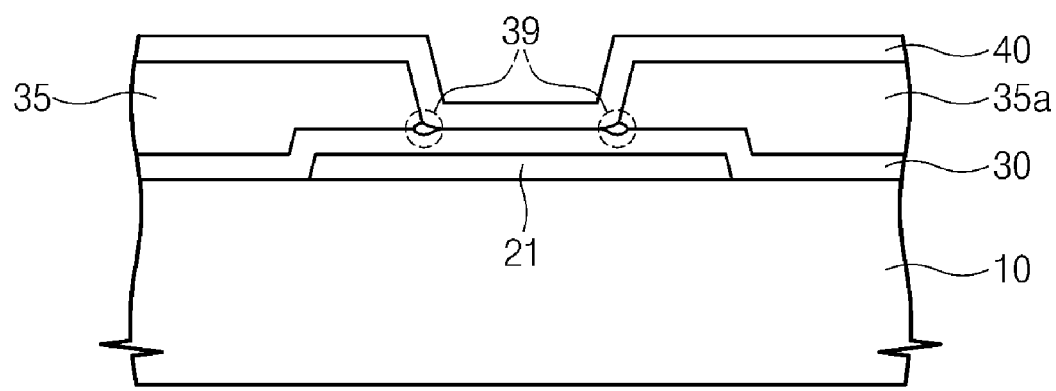

Referring to FIG. 5D, a semiconductor layer 40 may be formed on the photoresist pattern 35a and the gate insulating layer 30 through a chemical vapor deposition method.

Figure 5E:
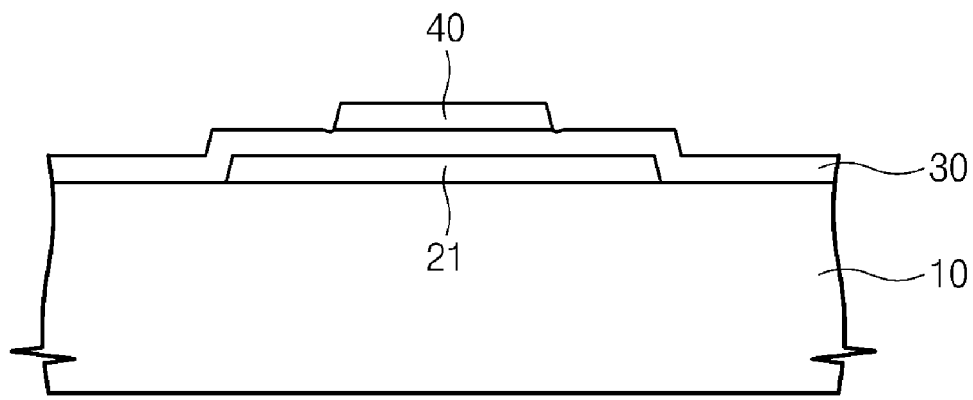

Then, as shown in FIG. 5E, the photoresist pattern 35a may be separated from the gate insulating layer 30 using a lift-off method. That is, when the photoresist pattern 35a is dipped into a development solution, the photoresist pattern 35a is removed together with a portion of the semiconductor layer 40, which is formed on the photoresist pattern 35a. Thus, a portion of the semiconductor layer 40, which is formed on the gate insulating layer 30, may remain on the gate insulating layer 30.

Figure 5F:
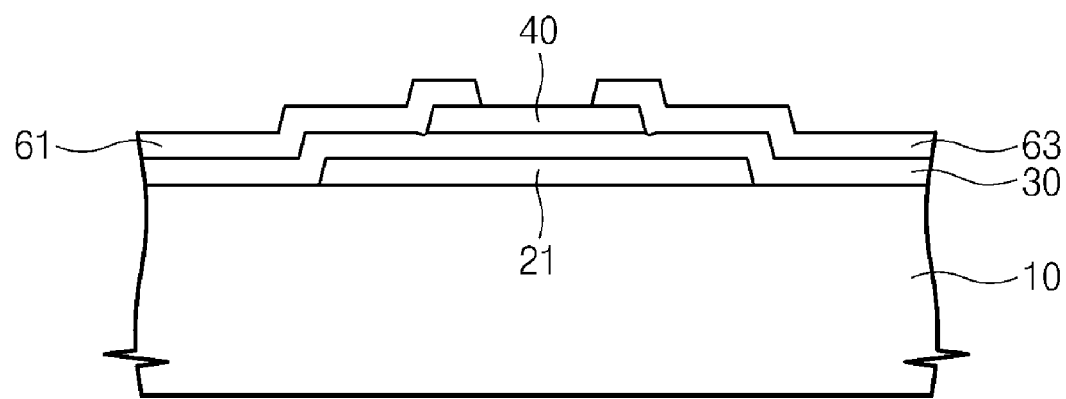

Referring to FIG. 5F, a data metal is formed on the gate insulating layer 30 and the semiconductor layer 40 and then is patterned to form a source electrode 61 and a drain electrode 63.

Figure 5G:
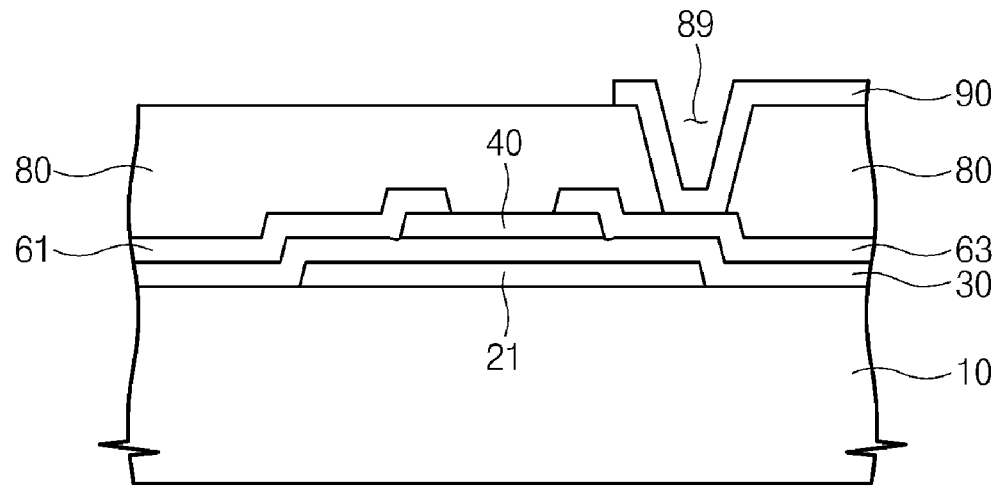

Referring to FIG. 5G, a protective layer 80 is formed above the substrate 10 to cover the semiconductor layer 40, the source electrode 61, and the drain electrode 63. The protective layer 80 is partially etched to form a contact hole 89 through which a portion of the drain electrode 63 is exposed. Then, a pixel electrode 90 is formed on the protective layer 80, and the pixel electrode 90 is connected to the drain electrode 63 through the contact hole 89. In this exemplary embodiment, the pixel electrode 90 may be a transparent conductive material.

FIG. 6A, FIG. 6B, FIG. 6C, and FIG. 6D are process views showing a method of manufacturing a display substrate according to another exemplary embodiment of the present invention. In FIG. 6A, FIG. 6B, FIG. 6C, and FIG. 6D, the processes that are the same as those described with reference to FIG. 5A, FIG. 5B, FIG. 5C, FIG. 5D, FIG. 5E, FIG. 5F, and FIG. 5G will be omitted.

Figure 6A:
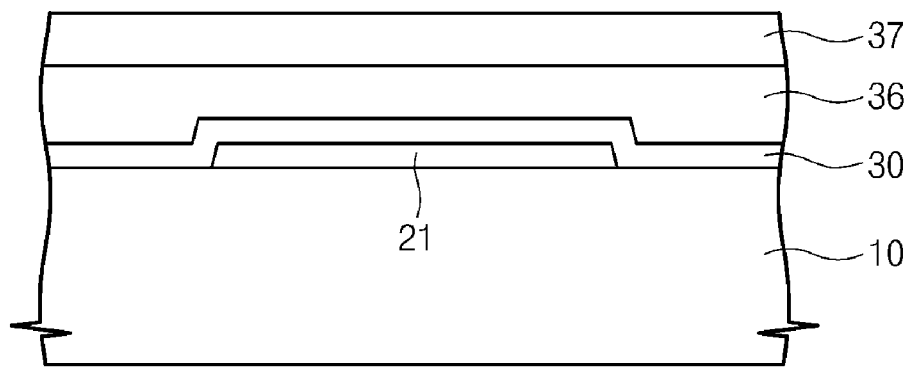
FIG. 6A, FIG. 6B, FIG. 6C, and FIG. 6D are process views showing a method of manufacturing a display substrate according to another exemplary embodiment of the present invention.

Referring to FIG. 6A, a gate metal is deposited on a substrate 10, which may include a transparent plastic material, and is patterned to form a gate electrode 21. A gate insulating layer 30 including an insulating material is formed on the substrate 10 and the gate electrode 21. Then, a first photoresist layer 36 and a second photoresist layer 37 are sequentially formed on the gate insulating layer 30. The first and second photoresist layers 36 and 37 may have different etch selectivities from each other.

Figure 6B:
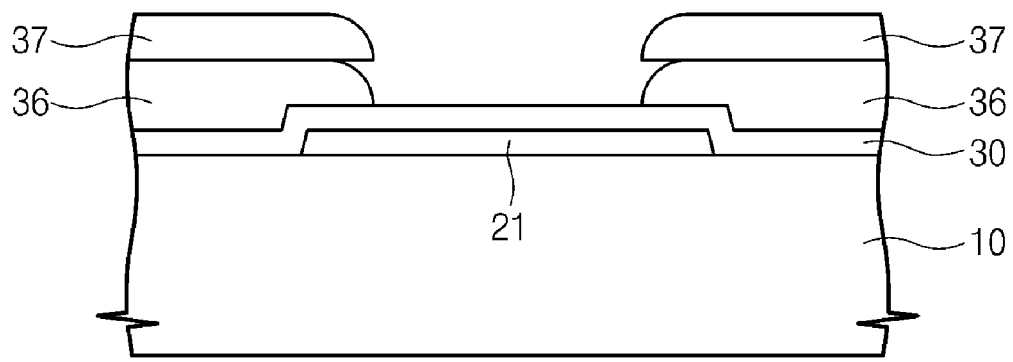

Then, referring to FIG. 6B, a portion of each of the first and second photoresist layers 36 and 37 is etched to expose a portion of an upper surface of the gate insulating layer 30, which overlaps with the gate electrode 21. To this end, one mask may be used to sequentially etch the first and second photoresist layers 36 and 37.

Figure 6C:
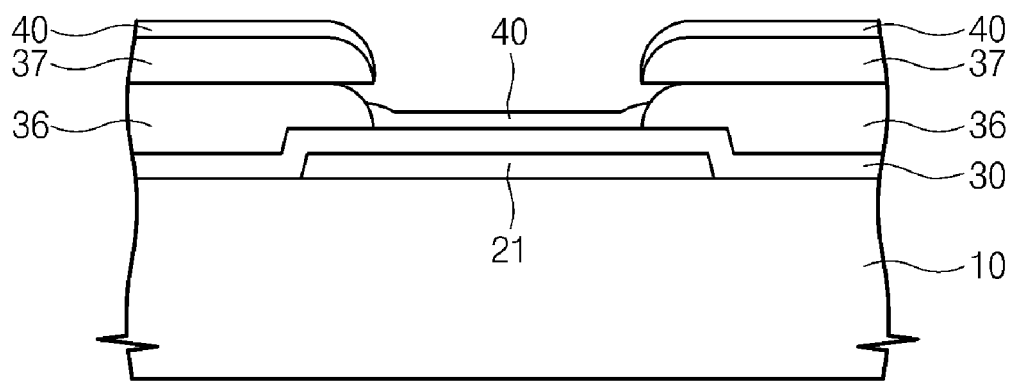

Referring to FIG. 6C, a semiconductor layer 40 is formed on the gate insulating layer 30 and the second photoresist layer 37. The semiconductor layer 40 may partially cover a side surface of the first photoresist layer 36. Then, the first and second photoresist layers 36 and 37 are removed from the gate insulating layer 30 through a lift-off method, and thus the semiconductor layer 40 may be partially formed on the gate insulating layer 30 to overlap with the gate electrode 21.

Figure 6D:
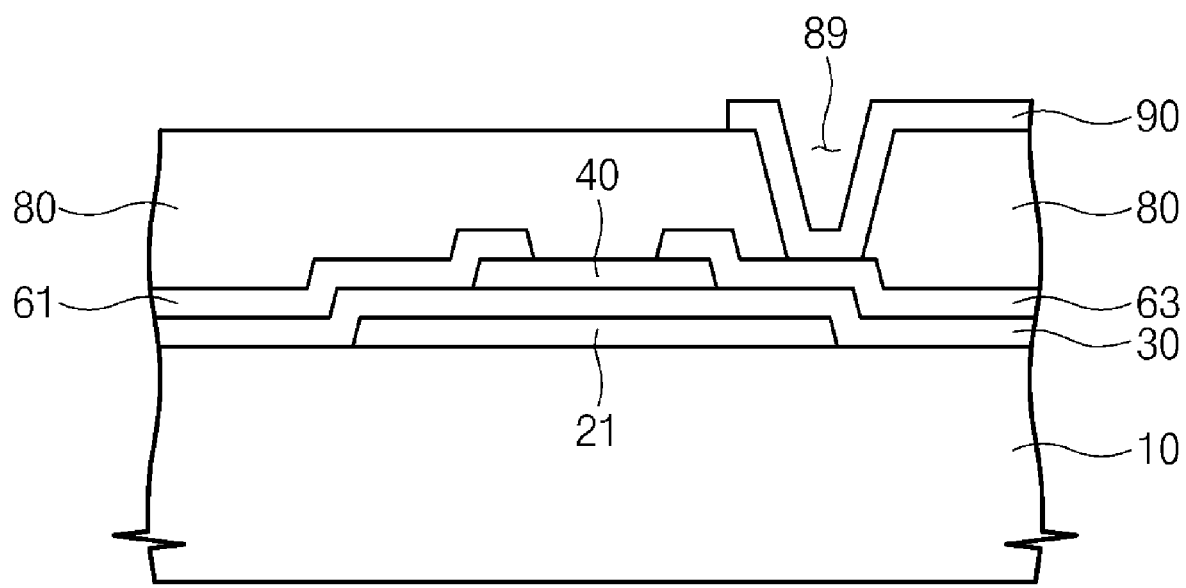

Referring to FIG. 6D, a source electrode 61 and a drain electrode 63 spaced apart from the source electrode 61 are formed on the gate insulating layer 30 such that each of the source and drain electrodes 61 and 63 partially overlaps with the semiconductor layer 40. Next, a protective layer 80 is formed above the substrate 10 to cover the semiconductor layer 40, the source electrode 61, and the drain electrode 63. The protective layer 80 is partially etched to form a contact hole 89 through which a portion of the drain electrode 63 is exposed. Then, a pixel electrode 90 is formed on the protective layer 80, and thus the pixel electrode 90 is connected to the drain electrode 63 through the contact hole 89.

According to exemplary embodiments of the present invention, the gate electrode, the gate insulating layer, and the semiconductor layer may be formed on the transparent plastic substrate and may all have the same shape, and the gate electrode may be insulated from the gate insulating layer and the semiconductor layer by the color filter layer. Accordingly, misalignment of the gate electrode and the semiconductor layer may be prevented, thereby improving characteristics of the thin film transistor.

In addition, the gate electrode, the gate insulating layer, and the semiconductor layer may be formed through a single mask process. Further, misalignment of the gate electrode and the semiconductor layer may be prevented by the use of a photoresist.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A display substrate, comprising:
   a substrate;
   a gate electrode arranged on the substrate;
   a gate insulating layer arranged on an area corresponding to an area where the gate electrode is formed;
   a semiconductor layer arranged on an area corresponding to an area where the gate insulating layer is formed;

a color filter layer arranged on the substrate and exposing the semiconductor layer;

a source electrode arranged on the color filter layer and the semiconductor layer;

a drain electrode spaced apart from the source electrode and arranged on the color filter layer and the semiconductor layer;

a protective layer arranged on the semiconductor layer, the source electrode, and the drain electrode; and a pixel electrode arranged on the protective layer and connected to the drain electrode, wherein the gate electrode, the gate insulating layer, and the semiconductor layer have the same shape as each other in a plan view.

2. The display substrate of claim 1, wherein the color filter layer covers a portion of the semiconductor layer.

3. The display substrate of claim 2, wherein a distance between the source electrode and the drain electrode is defined by the color filter layer.

4. The display substrate of claim 1, wherein the substrate comprises a transparent plastic material.

5. The display substrate of claim 4, wherein the plastic material comprises a material selected from the group consisting of kapton, polyethersulphone (PES), polycarbonate (PC), polyimide (PI), polyethyleneterephthalate (PET), polyethylenenaphthalate (PEN), polyacrylate (PAR), and fiber reinforced plastic (FRP).

6. The display substrate of claim 1, further comprising a storage line arranged on the color filter layer.

* * * * *